(12) United States Patent
Fukaya

(10) Patent No.: US 9,337,620 B2
(45) Date of Patent: May 10, 2016

(54) OPTICAL DEVICE AND MANUFACTURING METHOD THEREFOR

(71) Applicant: DISCO CORPORATION, Tokyo (JP)

(72) Inventor: Kota Fukaya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/591,166

(22) Filed: Jan. 7, 2015

(65) Prior Publication Data
US 2015/0207297 A1   Jul. 23, 2015

(30) Foreign Application Priority Data
Jan. 21, 2014   (JP) .................................. 2014-008338

(51) Int. Cl.
| | |
|---|---|
| *H01L 21/00* | (2006.01) |
| *H01S 5/18* | (2006.01) |
| *H01L 33/00* | (2010.01) |
| *H01L 33/20* | (2010.01) |
| *H01L 33/58* | (2010.01) |

(52) U.S. Cl.
CPC ................ *H01S 5/18* (2013.01); *H01L 33/005* (2013.01); *H01L 33/20* (2013.01); *H01L 33/58* (2013.01); *H01L 2933/0058* (2013.01)

(58) Field of Classification Search
CPC . H01L 21/78; H01L 33/20; H01L 2933/0058; H01S 5/18

USPC .................................................. 438/114, 463
See application file for complete search history.

(56) References Cited

U.S. PATENT DOCUMENTS

| | | | | |
|---|---|---|---|---|
| 2007/0111477 | A1* | 5/2007 | Maruyama ......... | B23K 26/0057 438/460 |
| 2015/0064824 | A1* | 3/2015 | Fukaya ............... | H01L 33/0095 438/33 |
| 2016/0016257 | A1* | 1/2016 | Hosseini ............ | B23K 26/0648 65/112 |

FOREIGN PATENT DOCUMENTS

| | | |
|---|---|---|
| JP | 10-305420 | 11/1998 |
| JP | 2008-006492 | 1/2008 |

* cited by examiner

*Primary Examiner* — Kimberly Rizkallah
*Assistant Examiner* — Maria Ligai
(74) *Attorney, Agent, or Firm* — Greer Burns & Crain, Ltd.

(57) ABSTRACT

An optical device including a substrate and a light emitting layer formed on the front surface of the substrate. Both the front surface and the back surface of the substrate are parallel to each other and have substantially the same rectangular shape. The substrate has four side surfaces connecting the front surface and the back surface of the substrate. Of the four side surfaces, each of the two side surfaces adjacent to each other has a convex sectional shape between the front surface and the back surface of the substrate, and each of the other two side surfaces adjacent to each other has a concave sectional shape between the front surface and the back surface of the substrate.

1 Claim, 7 Drawing Sheets

OPTICAL DEVICE AND MANUFACTURING METHOD THEREFOR

BACKGROUND OF THE INVENTION

1. Field of the Invention

The present invention relates to an optical device composed of a substrate and a light emitting layer formed on the front surface of the substrate and also to a manufacturing method for the optical device.

2. Description of the Related Art

In a fabrication process for an optical device such as a laser diode (LD) and a light emitting diode (LED), a light emitting layer (epitaxial layer) is formed by epitaxial growth, for example, on the upper surface (front surface) of a crystal growing substrate of sapphire, SiC, or the like, thereby manufacturing an optical device wafer for forming a plurality of optical devices. The light emitting layer formed on the crystal growing substrate of the optical device wafer is partitioned by a plurality of crossing division lines to define a plurality of separate regions where the plural optical devices such as LDs and LEDs are respectively formed. The optical device wafer is divided along these division lines to obtain the individual optical devices as chips.

As a method of dividing the optical device wafer along the division lines, there are known methods as described in Japanese Patent Laid-Open Nos. Hei 10-305420 and 2008-006492. The dividing method described in Japanese Patent Laid-Open No. Hei 10-305420 includes the steps of applying a pulsed laser beam having an absorption wavelength to the wafer along the division lines to form a laser processed groove along each division line and next applying an external force to the wafer to thereby break the wafer along each division line where the laser processed groove is formed as a division start point.

On the other hand, the dividing method described in Japanese Patent Laid-Open No. 2008-006492 is intended to improve the luminance of the optical device and it includes the steps of applying a pulsed laser beam having a transmission wavelength to the wafer along the division lines in the condition where the focal point of the pulsed laser beam is set inside the wafer, thereby forming a modified layer inside the wafer along each division line and next applying an external force to each division line where the modified layer is formed to be reduced in strength, thereby dividing the wafer along each division line.

SUMMARY OF THE INVENTION

In each of the dividing methods described in Japanese Patent Laid-Open Nos. Hei 10-305420 and 2008-006492, the laser beam is directed to the optical device wafer substantially perpendicularly thereto to form the laser processed groove or the modified layer and then divide the optical device wafer along the laser processed groove or the modified layer as a division start point, thereby obtaining the individual optical devices. Each optical device has a rectangular boxlike shape such that each side surface is substantially perpendicular to the light emitting layer formed on the front surface of the substrate. Accordingly, of the light emitted from the light emitting layer of the optical device, the proportion of the light striking each side surface at an incident angle greater than the critical angle is large. As a result, the proportion of the light totally reflected on each side surface is large, so that there is a possibility that the light repeating the internal total reflection in the substrate may finally become extinct in the substrate. Accordingly, the light extraction efficiency of the optical device is reduced to cause a reduction in luminance.

It is therefore an object of the present invention to provide an optical device and a manufacturing method therefor which can improve the light extraction efficiency.

In accordance with an aspect of the present invention, there is provided an optical device including a substrate; and a light emitting layer formed on the front surface of the substrate; both the front surface and the back surface of the substrate being parallel to each other and having substantially the same rectangular shape; the substrate having four side surfaces connecting the front surface and the back surface of the substrate; wherein of the four side surfaces, each of the two side surfaces adjacent to each other has a convex sectional shape between the front surface and the back surface of the substrate, and each of the other two side surfaces adjacent to each other has a concave sectional shape between the front surface and the back surface of the substrate.

With this configuration, each side surface of the substrate of the optical device has an arcuate sectional shape. Accordingly, of the light emitted from the light emitting layer and striking each side surface, the proportion of the light striking each side surface at an incident angle less than or equal to the critical angle can be increased. As a result, the proportion of the light totally reflected on each side surface and returned to the light emitting layer can be reduced to thereby increase the proportion of the light emerging from each side surface. That is, the light extraction efficiency can be improved.

In accordance with another aspect of the present invention, there is provided a manufacturing method for optical devices each including a substrate; and a light emitting layer formed on the front surface of the substrate; both the front surface and the back surface of the substrate being parallel to each other and having substantially the same rectangular shape; the substrate having four side surfaces connecting the front surface and the back surface of the substrate; wherein of the four side surfaces, each of the two side surfaces adjacent to each other has a convex sectional shape between the front surface and the back surface of the substrate, and each of the other two side surfaces adjacent to each other has a concave sectional shape between the front surface and the back surface of the substrate, the manufacturing method including an attaching step of attaching a protective tape to the front side of an optical device wafer having a light emitting layer on the front side, the light emitting layer of the optical device wafer being partitioned by a plurality of crossing division lines to define a plurality of separate regions where the optical devices are respectively formed; a modified layer forming step of applying a laser beam having a transmission wavelength to the optical device wafer along each division line from the back side of the optical device wafer after performing the attaching step, in the condition where the focal point of the laser beam is adjusted inside the optical device wafer so as to be stepwise shifted along the thickness of the optical device wafer from the front side to the back side thereof, thereby forming a plurality of modified layers juxtaposed in the direction along the thickness of the optical device wafer; and a dividing step of applying an external force to the optical device wafer after performing the modified layer forming step, thereby dividing the optical device wafer along each division line to obtain the individual optical devices; the plurality of modified layers juxtaposed in the direction along the thickness of the optical device wafer being arcuately arranged in the direction along the thickness of the optical device wafer in the modified layer forming step; a crack being formed between any adjacent ones of the plural modified layers arcuately arranged in the direction along the thickness of the optical device wafer in the dividing step, thereby dividing the optical device wafer along each division line so as to form an arcuate sectional shape corresponding to the shape of each side surface of the substrate of each optical device.

According to this method, the optical device having arcuate side surfaces can be manufactured without complication of each step and elongation of the time of each step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
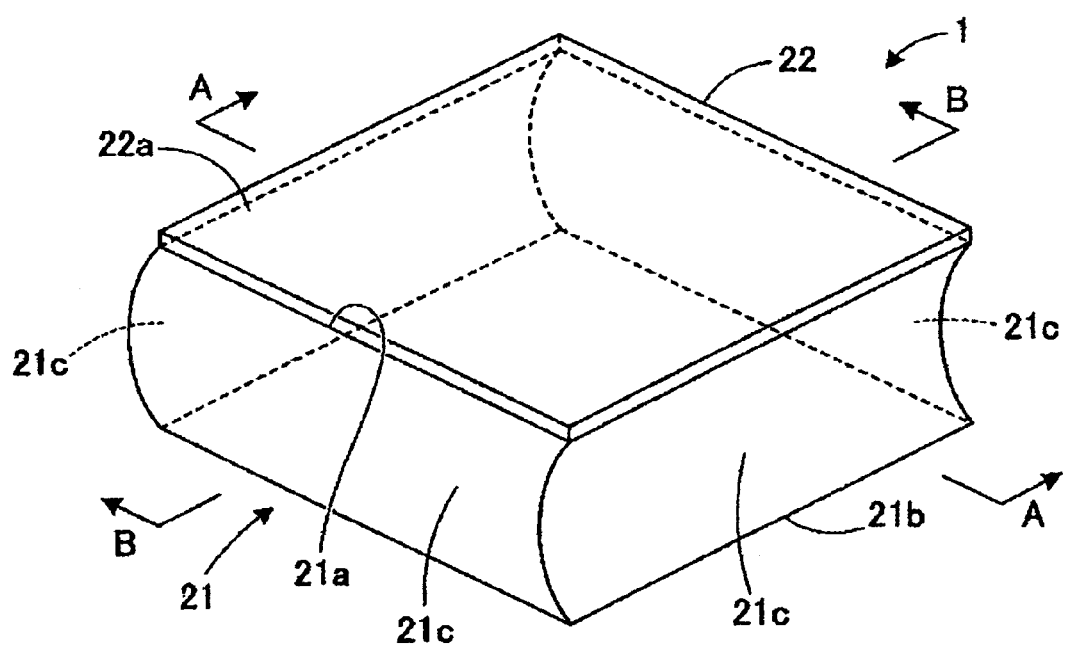
FIG. 1 is a schematic perspective view of an optical device according to a preferred embodiment of the present invention.
Figure 2:
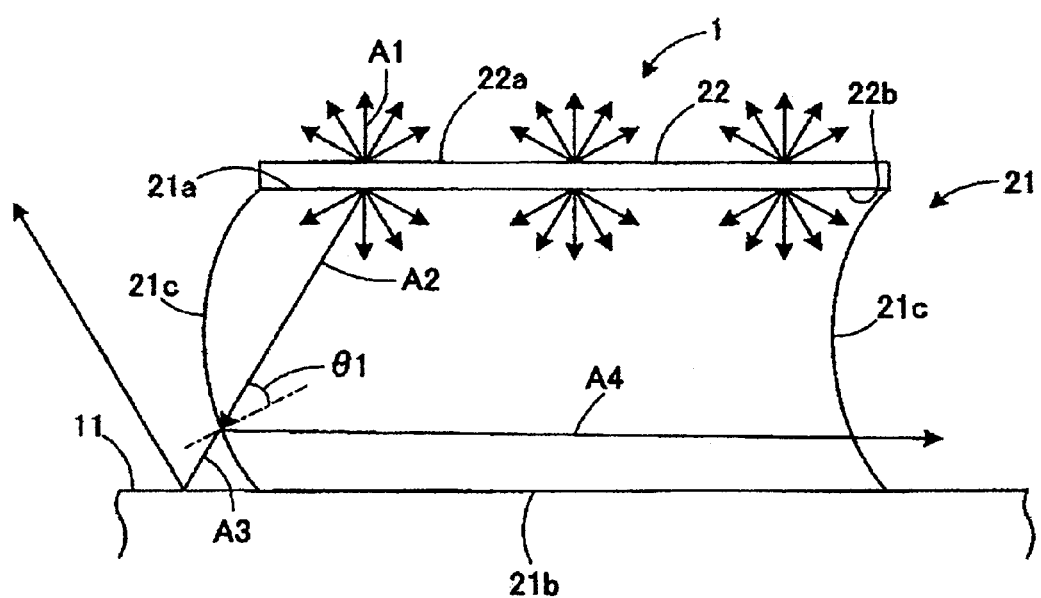
FIG. 2 is a schematic sectional view for illustrating a manner of emission of light from the optical device shown in FIG. 1.

A preferred embodiment of the optical device and the manufacturing method therefor according to the present invention will now be described in detail with reference to the attached drawings. There will first be described a preferred embodiment of the optical device according to the present invention with reference to FIGS. 1 and 2. FIG. 1 is a schematic perspective view of an optical device 1 according to this preferred embodiment, and FIG. 2 is a schematic sectional view for illustrating a manner of emission of light from the optical device 1 shown in FIG. 1. FIG. 2 is a cross section taken along the line A-A in FIG. 1 and it is also a cross section taken along the line B-B in FIG. 1.

As shown in FIGS. 1 and 2, the optical device 1 is adapted to be mounted on a base 11 (not shown in FIG. 1) by wire bonding or flip chip bonding. The optical device 1 is composed of a substrate 21 and a light emitting layer 22 formed on a front surface 21a of the substrate 21. The substrate 21 is a crystal growing substrate selected from a sapphire substrate ($Al_2O_3$ substrate), gallium nitride substrate (GaN substrate), silicon carbide substrate (SiC substrate), and gallium oxide substrate ($Ga_2O_3$ substrate), for example. The substrate 21 is preferably formed of a transparent material.

The light emitting layer 22 is formed by the epitaxial growth of an n-type semiconductor layer (e.g., n-type GaN layer) in which electrons function as majority carrier, a semiconductor layer (e.g., InGaN layer), and a p-type semiconductor layer (e.g., p-type GaN layer) in which holes function as majority carrier. These layers are epitaxially grown in this order on the front surface 21a of the substrate 21. The light emitting layer 22 is formed with two electrodes (not shown) respectively connected to the n-type semiconductor layer and the p-type semiconductor layer. A voltage from an external power source is applied to the two electrodes to thereby emit light from the light emitting layer 22.

Both the front surface 21a and the back surface 21b of the substrate 21 have substantially the same rectangular shape as viewed in plan and they are parallel to each other. The substrate 21 has four side surfaces 21c respectively connecting the four sides of the front surface 21a and the four sides of the back surface 21b. Of the four side surfaces 21c, the two side surfaces 21c located adjacent to each other on the left side as viewed in FIG. 1 have the same sectional shape as taken along the thickness of the substrate 21 such that the sectional shape of each side surface 21c is convex between the front surface 21a and the back surface 21b. Further, the other two side surfaces 21c located adjacent to each other on the right side as viewed in FIG. 1 have the same sectional shape as taken along the thickness of the substrate 21 such that the sectional shape of each side surface 21c is concave between the front surface 21a and the back surface 21b. The sectional shape of each side surface 21c is uniform in the direction of extension of the corresponding sides of the front surface 21a and the back surface 21b. The convex or concave sectional shape of each side surface 21c includes a circular or elliptical arc and any other curved lines, e.g., a curved line such that the intermediate portion in the direction of the thickness of the substrate 21 is convex or concave.

Figure 3:
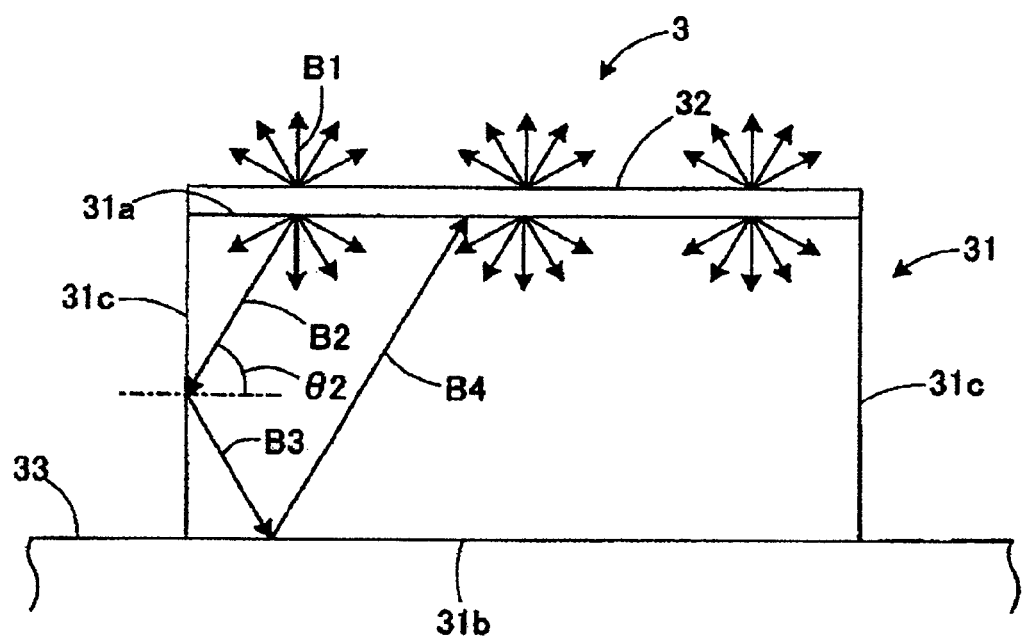
FIG. 3 is a schematic sectional view for illustrating a manner of emission of light from a conventional optical device as a comparison.

The luminance improving effect by the optical device 1 shown in FIG. 2 will now be described in comparison with a conventional optical device 3 shown in FIG. 3. FIG. 3 is a schematic sectional view for illustrating a manner of emission of light from the optical device 3 as a comparison. The optical device 3 shown in FIG. 3 is similar to the optical device 1 shown in FIG. 2 except the shape of each side surface 21c of the substrate 21. More specifically, the optical device 3 shown in FIG. 3 is composed of a substrate 31 and a light emitting layer 32 formed on a front surface 31a of the substrate 31. Both the front surface 31a and a back surface 31b of the substrate 31 have substantially the same rectangular shape as viewed in plan. The optical device 3 is mounted on a base 33. The substrate 31 has four side surfaces 31c, each of which is a flat surface perpendicular to the front surface 31a and the back surface 31b.

As shown in FIG. 2, the light generated in the light emitting layer 22 of the optical device 1 according to this preferred embodiment is emitted mainly from the front surface 22a and the back surface 22b. The light emitted from the front surface 22a of the light emitting layer 22 (e.g., optical path A1) is extracted through a lens member (not shown) or the like to the outside. On the other hand, the light emitted from the back surface 22b of the light emitting layer 22 and propagating along an optical path A2 strikes the interface between the convex side surface 21c (left side surface 21c as viewed in FIG. 2) of the substrate 21 and an air layer at an incident angle θ1. Since the side surface 21c is arcuate, the incident surface which the light propagating along the optical path A2 strikes is oriented (inclined) toward the light emitting layer 22 as compared with a vertical flat surface. Accordingly, the incident angle θ1 of the light propagating along the optical path A2 is so small as to be less than or equal to the critical angle of the substrate 21. Accordingly, the light propagating along the optical path A2 is partially transmitted through the side surface 21c to the air layer (optical path A3), and the remaining light is reflected on the side surface 21c (optical path A4).

The light propagating along the optical path A3 is next reflected on the upper surface of the base 11 and extracted to the outside. The light propagating along the optical path A4 travels in the substrate 21 in a nearly horizontal direction as viewed in FIG. 2 because the incident angle 01 is small as mentioned above. The light thus traveling in the substrate 21 strikes the opposite side surface 21c (right side surface 21c as viewed in FIG. 2) and is next emerged to the air layer.

In contrast thereto, the light is emitted from the optical device 3 as a comparison shown in FIG. 3 to propagate along optical paths B1 and B2. The optical paths B1 and B2 of the light emitted from the optical device 3 are similar to the optical paths A1 and A2 of the light emitted from the optical device 1. However, since each side surface 31c of the substrate 31 is a flat surface perpendicular to the front surface 31a and the back surface 31b, an incident angle 02 of the light propagating along the optical path B2 and striking the interface between the side surface 31c and the air layer is larger than the incident angle 01 shown in FIG. 2. Accordingly, the incident angle 02 is larger than the critical angle of the substrate 21, so that the light propagating along the optical path B2 is totally reflected on the interface between the side surface 31c and the air layer (optical path B3). The light propagating along the optical path B3 is reflected on the upper surface of the base 33 (optical path B4). The light propagating along the optical path B4 travels in the substrate 31 in a nearly vertical direction as viewed in FIG. 3 in comparison with the optical path A4. Accordingly, the light propagating along the optical path B4 strikes the light emitting layer 32 and is absorbed by the light emitting layer 32, so that the light cannot be extracted to the outside.

According to the optical device 1 shown in FIG. 2, each side surface 21c of the substrate 21 is arcuate, so that the light emitted from the light emitting layer 22 and propagating in the substrate 21 along optical paths similar to the optical path A2 can be extracted to the outside along optical paths similar to the optical paths A3 and A4. Accordingly, as compared with the light propagating along optical paths similar to the optical path B2 shown in FIG. 3, the proportion of the light totally reflected on each side surface 21c to the light propagating along optical paths similar to the optical path A2 can be reduced. Accordingly, the propagation of the light repeatedly reflected in the substrate 21 and returned to the light emitting layer 22 can be reduced and the proportion of the light emerging from the substrate 21 can be increased to thereby improve the light extraction efficiency, resulting in the improvement in luminance.

There will now be described the preferred embodiment of the optical device manufacturing method according to the present invention. The optical device manufacturing method in this preferred embodiment includes an attaching step, a modified layer forming step by a laser processing apparatus, and a dividing step by a dividing apparatus. In the attaching step, an adhesive sheet (protective tape) is attached to the front side of an optical device wafer on which a light emitting layer is formed. In the modified layer forming step, a plurality of modified layers are formed inside the optical device wafer along each division line. In the dividing step, the optical device wafer is divided along each division line where the modified layers are formed as a division start point, thereby obtaining a plurality of individual optical devices. These steps of the manufacturing method will now be described in more detail.

Figure 4:
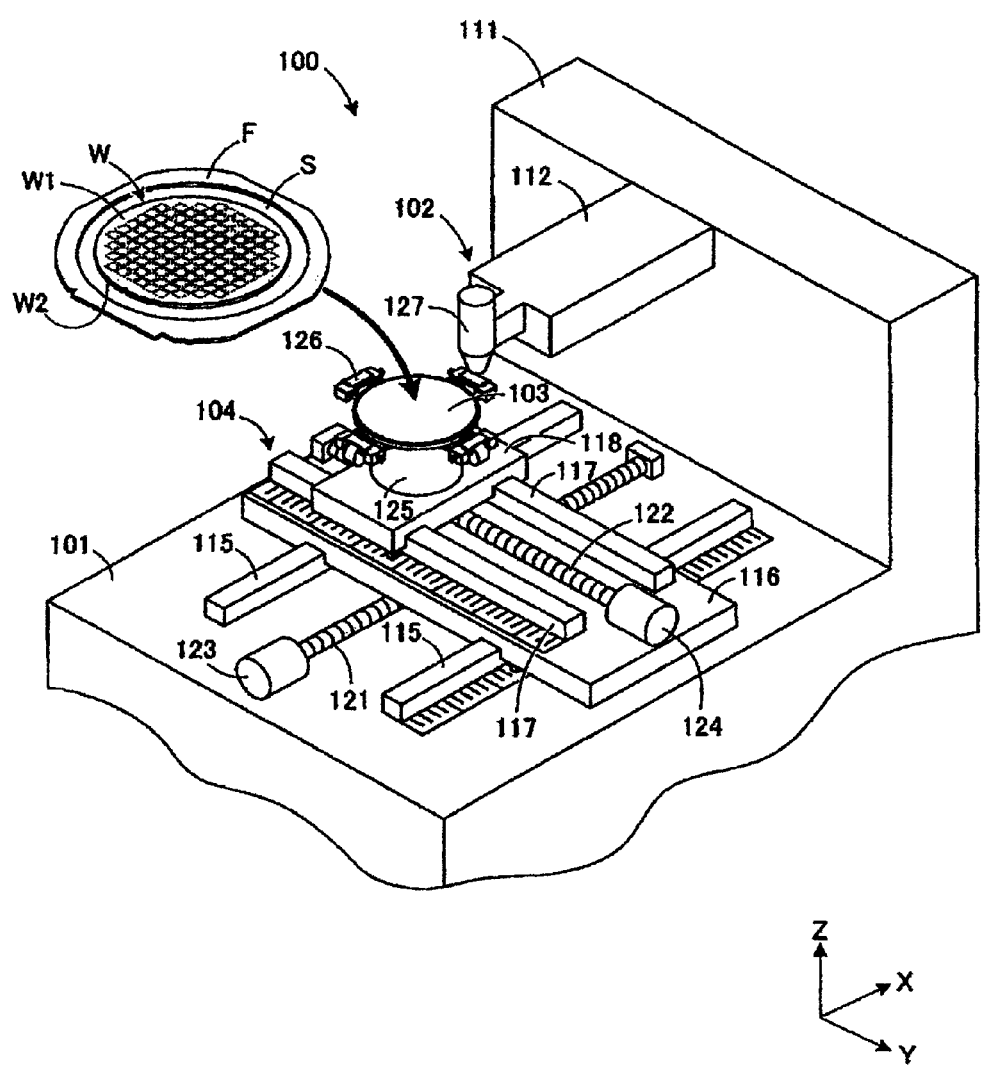
FIG. 4 is a perspective view of a laser processing apparatus to be used in manufacturing the optical device shown in FIG. 1.

Referring to FIG. 4, there is shown a perspective view of a laser processing apparatus 100 for forming the modified layers inside the optical device wafer in this preferred embodiment. The configuration of the laser processing apparatus usable in the present invention is not limited to that shown in FIG. 4. That is, any configuration capable of forming the modified layers inside the optical device wafer may be adopted as the laser processing apparatus. As shown in FIG. 4, the laser processing apparatus 100 includes a laser processing unit 102 for applying a laser beam to an optical device wafer W held on a chuck table (holding means) 103, wherein the laser processing unit 102 and the chuck table 103 are relatively moved to process the optical device wafer W.

The laser processing apparatus 100 has a boxlike base 101. There is provided on the upper surface of the base 101 a chuck table moving mechanism 104 for feeding the chuck table 103 in the X direction extending along an X axis shown in FIG. 4 and also indexing the chuck table 103 in the Y direction extending along a Y axis shown in FIG. 4. A wall portion 111 stands from the base 101 at its rear end behind the chuck table moving mechanism 104. An arm portion 112 projects from the front surface of the wall portion 111. The laser processing unit 102 is supported to the arm portion 112 so as to be opposed to the chuck table 103.

The chuck table moving mechanism 104 includes a pair of parallel guide rails 115 provided on the upper surface of the base 101 so as to extend in the X direction and a motor-driven X table 116 slidably supported to the guide rails 115. The chuck table moving mechanism 104 further includes a pair of parallel guide rails 117 provided on the upper surface of the X table 116 so as to extend in the Y direction and a motor-driven Y table 118 slidably supported to the guide rails 117.

The chuck table 103 is provided on the upper surface of the Y table 118. Nut portions (not shown) are formed on the lower surfaces of the X table 116 and the Y table 118, and ball screws 121 and 122 are threadedly engaged with these nut portions of the X table 116 and the Y table 118, respectively. Drive motors 123 and 124 are connected to the end portions of the ball screws 121 and 122, respectively. Accordingly, when the ball screws 121 and 122 are rotationally driven by the drive motors 123 and 124, respectively, the chuck table 103 is moved in the X direction and the Y direction along the guide rails 115 and 117, respectively.

The chuck table 103 is a circular member and it is rotatably provided on the upper surface of the Y table 118 through a θ table 125. A suction holding member (not shown) of a porous ceramic material is formed on the upper surface of the chuck table 103. Four clamps 126 are provided on the outer circumference of the chuck table 103, wherein each clamp 126 is supported through a pair of arms to the chuck table 103. The four clamps 126 are driven by an air actuator (not shown) to thereby fix a ring frame F supporting the optical device wafer W through an adhesive sheet S.

The laser processing unit 102 has a processing head 127 provided at the front end of the arm portion 112. An optical system is provided in the arm portion 112 and the processing head 127 to constitute the laser processing unit 102. More specifically, a laser oscillator (not shown) is provided in the arm portion 112, and the processing head 127 includes a focusing lens (not shown) for focusing a laser beam oscillated from the laser oscillator to the optical device wafer W held on the chuck table 103, thereby processing the optical device wafer W. In this case, the laser beam has a transmission wavelength to the optical device wafer W, and the focal point of the laser beam is adjusted by the optical system so that the laser beam is focused inside the optical device wafer W.

By the application of the laser beam to the optical device wafer W, a plurality of modified layers (reformed layers) R (see FIGS. 5B and 6B) as a division start point are formed inside the optical device wafer W along each division line. Each modified layer R is a region different from its ambient region in density, refractive index, mechanical strength, or any other physical properties in the optical device wafer W irradiated with the laser beam, causing a reduction in strength as compared with the ambient region. Examples of each modified layer R include a melted and rehardened region, cracked region, breakdown region, and refractive index changed region. These regions may be mixed.

Figure 5A:
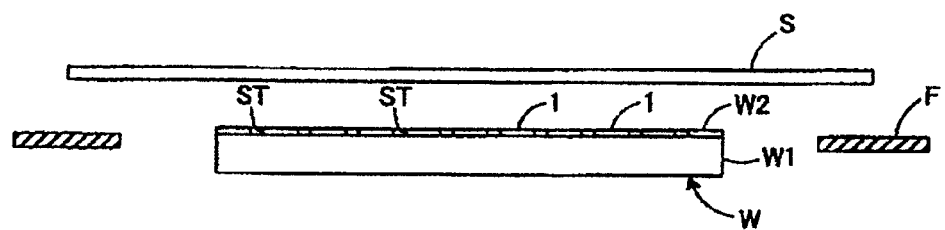
FIG. 5A is a sectional view for illustrating an attaching step.
Figure 6A:
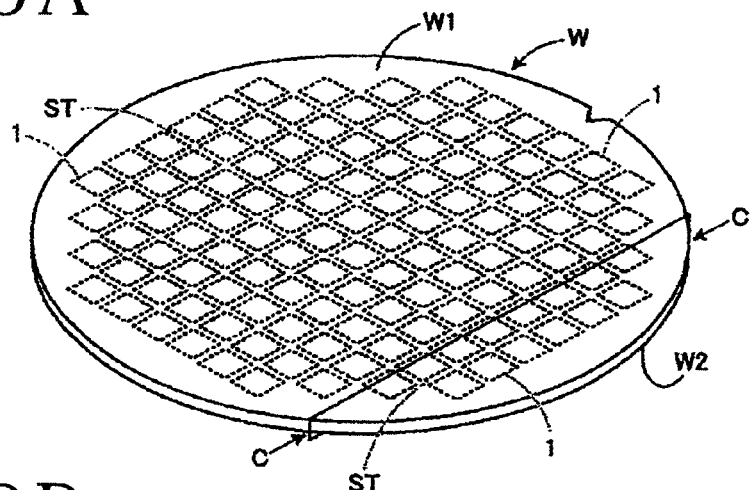
FIG. 6A is a schematic perspective view of an optical device wafer.

The optical device wafer W is a substantially disk-shaped member. As shown in FIGS. 5A and 6A, the optical device wafer W is composed of a substrate W1 and a light emitting layer W2 formed on the front side (upper surface as viewed in FIG. 5A) of the substrate W1. The light emitting layer W2 of the optical device wafer W is partitioned by a plurality of crossing division lines (streets) ST to define a plurality of separate regions where a plurality of optical devices 1 are respectively formed. As shown in FIG. 4, the optical device wafer W to be held on the chuck table 103 is attached to an adhesive sheet S supported to the ring frame F in the condition where the light emitting layer W2 is oriented downward, i.e., the substrate W1 is oriented upward.

Figure 5B:
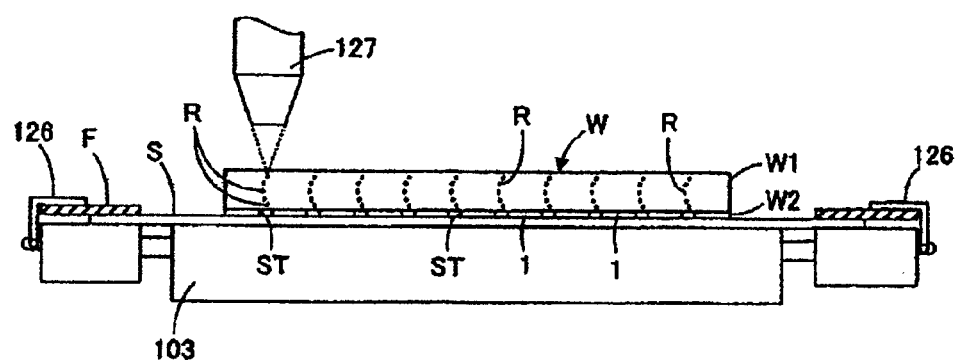
FIG. 5B is a sectional view for illustrating a modified layer forming step.
Figure 5C:
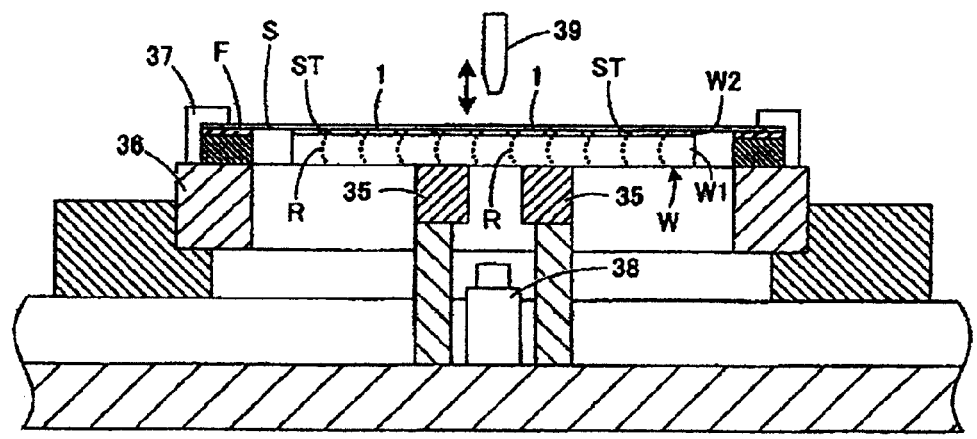
FIG. 5C is a sectional view for illustrating a dividing step.
Figure 6B:
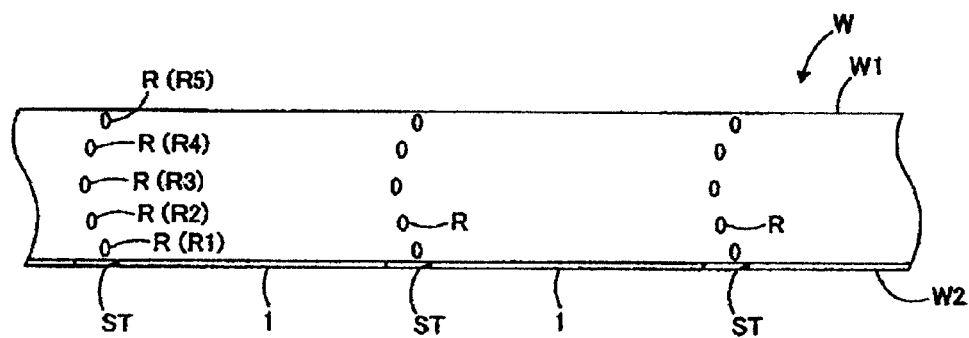
FIGS. 6B and 6C are cross sections taken along the line C-C in FIG. 6A for illustrating different conditions before and after breaking the optical device wafer shown in FIG. 6A.
Figure 6C:
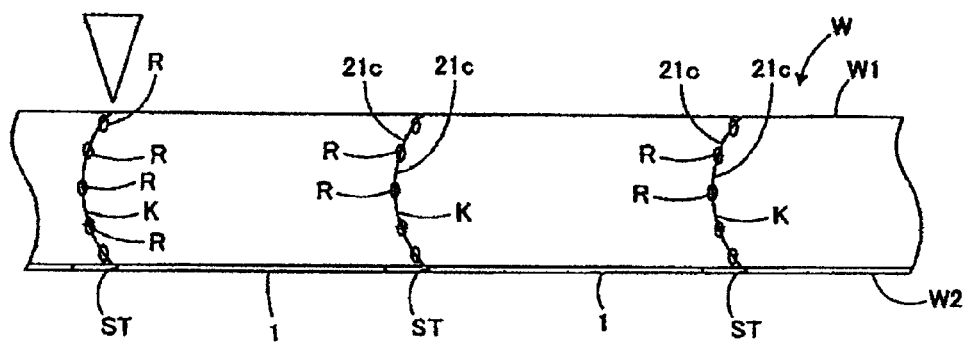
Figure 7A:
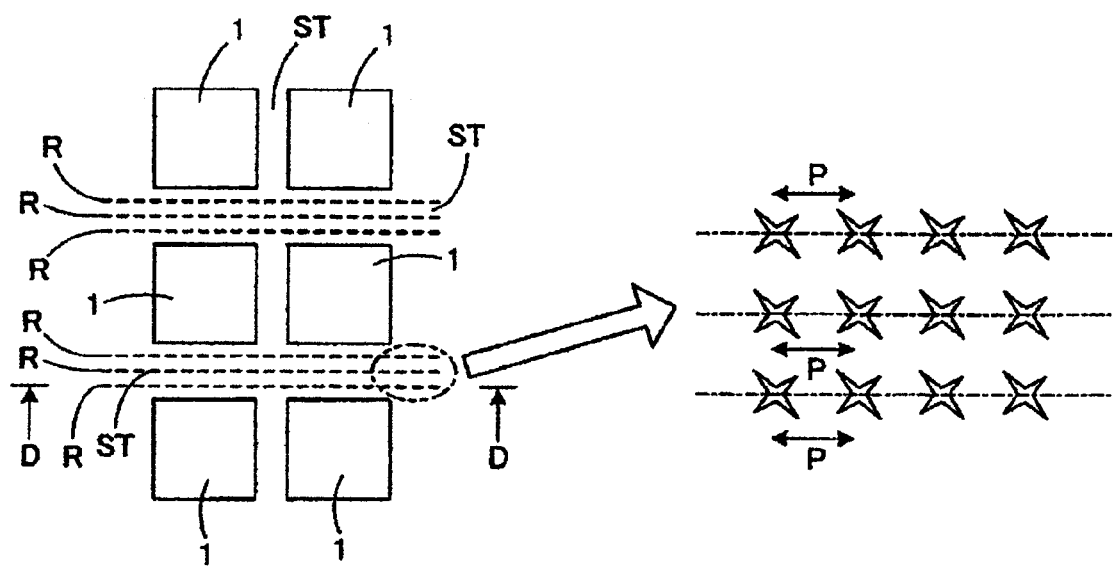
FIG. 7A is an enlarged plan view for illustrating the modified layer forming step.
Figure 7B:
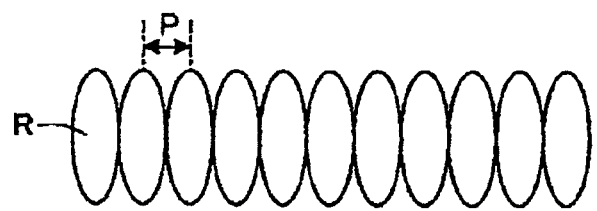
FIG. 7B is a schematic cross section taken along the line D-D in FIG. 7A.

The optical device manufacturing method by processing the optical device wafer W according to this preferred embodiment will now be described with reference to FIGS. 5A to 7B. FIGS. 5A to 5C are sectional views for illustrating the steps of the optical device manufacturing method. FIG. 6A is a schematic perspective view of the optical device wafer W, and FIGS. 6B and 6C are cross section taken along the line C-C in FIG. 6A for illustrating different conditions before and after breaking the optical device wafer W. FIG. 7A is an enlarged plan view for illustrating the modified layer forming step, and FIG. 7B is a schematic cross section taken along the line D-D in FIG. 7A. The steps shown in FIGS. 5A to 5C are merely illustrative and the steps of the optical device manufacturing method according to the present invention are not limited to those shown in FIGS. 5A to 5C.

The attaching step shown in FIG. 5A is first performed. As shown in FIG. 5A, the optical device wafer W is positioned inside the ring frame F in the condition where the light emitting layer W2 formed on the front side of the substrate W1 is oriented upward. Thereafter, the front side (upper surface) of the optical device wafer W (i.e., the light emitting layer W2) and the upper surface of the ring frame F are attached to the adhesive sheet S. Accordingly, the optical device wafer W is supported through the adhesive sheet S to the ring frame F in the condition where the substrate W1 of the wafer W is exposed.

After performing the attaching step, the modified layer forming step shown in FIG. 5B is performed. As shown in FIG. 5B, the optical device wafer W supported through the adhesive sheet S to the ring frame F is held on the chuck table 103 in the condition where the adhesive sheet S is in contact with the upper surface of the chuck table 103 and the ring frame F is fixed by the clamps 126. Further, the lower end (laser beam outlet) of the processing head 127 is positioned directly above a predetermined one of the division lines ST of the optical device wafer W, and the laser beam is applied from the processing head 127 toward the back side of the optical device wafer W (i.e., the back side of the substrate W1). The wavelength of the laser beam is set to a transmission wavelength to the optical device wafer W, and the focal point of the laser beam is set inside the substrate W1 of the optical device wafer W. As adjusting the focal point of the laser beam, the chuck table 103 holding the optical device wafer W is moved in the X direction and the Y direction shown in FIG. 4 to thereby form the plural modified layers R inside the optical device wafer W along each division line ST. As shown in FIG. 7A, each modified layer R along each division line ST is composed of plural spots arranged in a line with the pulse pitch P according to the wavelength of the laser beam. Further, as shown in FIG. 7B which is a cross section taken along the line D-D in FIG. 7A, plural vertically elongated ellipses are continuously arranged in a line to form each modified layer R.

As shown in FIG. 6B, the plural modified layers R along each division line ST are formed by changing the vertical position of the focal point of the laser beam along the thickness of the substrate W1. More specifically, the first modified layer R1 is formed by setting the vertical position of the focal point to a position above the front side (lower surface as viewed in FIG. 6B) of the optical device wafer W toward the back side (upper surface) thereof by a predetermined amount and then applying the laser beam along the predetermined division line ST. The formation of the first modified layer R1 is repeated for all of the division lines ST. Thereafter, the focal point is shifted upward by the predetermined amount to form the second modified layer R2 along each division line ST. More specifically, the focal point is set at a position above the first modified layer R1 as horizontally shifted therefrom along the width of each division line ST by a predetermined index. Thereafter, the third modified layer R3 is similarly formed above the second modified layer R2 by shifting the focal point upward by the predetermined amount and also shifting the focal point along the width of each division line ST by the predetermined index. Thereafter, the fourth and fifth modified layers R4 and R5 are similarly formed as shown in FIG. 6B. Thusly, the plural modified layers R (the first to fifth modified layers R1 to R5 in this preferred embodiment) are formed along each division line ST in such a manner that the plural modified layers R are vertically juxtaposed from the front side (lower surface as viewed in FIG. 6B) of the optical device wafer W to the back side (upper surface as viewed in FIG. 6B) thereof and horizontally shifted along the width of each division line ST so as to form an arcuate shape. In this manner, the plural modified layers R are formed as a division start point inside the optical device wafer W along each division line ST.

After performing the modified layer forming step, the dividing step shown in FIG. 5C is performed. As shown in FIG. 5C, the substrate W1 of the optical device wafer W is placed on a pair of parallel support beds 35 constituting a breaking apparatus (not shown), and the ring frame F supporting the optical device wafer W through the adhesive sheet S is placed on an annular table 36. The ring frame F placed on the annular table 36 is fixed by four clamps 37 provided on the annular table 36. The pair of parallel support beds 35 extend in one direction (perpendicular to the sheet plane of FIG. 5C), and imaging means 38 is located between the support beds 35 on the lower side thereof. The imaging means 38 functions to image the back side (lower surface as viewed in FIG. 5C) of the optical device wafer W, i.e., the back side of the substrate W1 from between the support beds 35.

A pressure blade 39 for pressing the optical device wafer W from the upper side thereof is provided above the support beds 35 at a horizontal position therebetween. That is, an external force is applied from the pressure blade 39 to the optical device wafer W held on the support beds 35. The pressure blade 39 extends in one direction (perpendicular to the sheet plane of FIG. 5C), and it is vertically movable by a pressure applying mechanism (not shown). When the back side of the optical device wafer W is imaged by the imaging means 38, a predetermined one of the division lines ST is positioned between the support beds 35 and directly below the pressure blade 39 according to an image obtained by the imaging means 38. Thereafter, the pressure blade 39 is lowered to abut against the optical device wafer W through the adhesive sheet S, thereby applying an external force to the optical device wafer W to divide the wafer W along the predetermined division line ST where the plural modified layers R as a division start point are formed. At this time, a crack K (see FIG. 6C) is formed between any adjacent ones of the plural modified layers R juxtaposed along the thickness of the wafer W and shifted along the width of the predetermined division line ST so as to form an arcuate shape. By the formation of the crack K, the optical device wafer W is divided along the predetermined division line ST so as to form an arcuate sectional shape corresponding to the shape of each side surface 21c shown in FIGS. 1 and 2. At this time, the plural modified layers R along the predetermined division line ST form the convex side surface 21c of one of the optical devices 1 adjacent to each other with the predetermined division line ST interposed therebetween, and simultaneously form the concave side surface 21c of the other optical device 1 (see FIG. 6C). This dividing step is similarly performed along all of the division lines ST to thereby divide the optical device wafer W into the individual optical devices 1.

An example of the laser processing conditions in the modified layer forming step is shown below. The defocus amount in this example indicates the distance from the back side (upper surface as viewed in FIG. 5B) of the optical device wafer W to the focal point in the direction along the thickness of the wafer W.

EXAMPLE

Power: 0.1 W
Work feed speed: 1000 mm/s
Number of modified layers R along each division line ST: 4
Defocus amount in forming the first modified layer R1: 40 μm
Defocus amount in forming the second modified layer R2: 32.5 μm
Defocus amount in forming the third modified layer R3: 25 μm
Defocus amount in forming the fourth modified layer R4: 17.5 μm
Index between the modified layers R1 and R2: 8 μm
Index between the modified layers R1 and R3: 16 μm
Index between the modified layers R1 and R4: 8 μm By using the optical device 1 obtained in Example, the total intensity (power) of light radiated was measured (total radiant flux measurement). As compared with the conventional optical device having the flat side surfaces as shown in FIG. 3, the luminance of the optical device 1 according to this preferred embodiment was improved by 1 to 2%.

According to the optical device manufacturing method in this preferred embodiment, the side surface 21c having an arcuate sectional shape can be formed in the direction of the thickness of the optical device wafer W so as to extend along each division line ST even in the case that the thickness of the wafer W is small. Further, the plural modified layers R juxtaposed along the thickness of the wafer W are shifted in the direction along the width of each division line ST so as to form an arcuate shape in the modified layer forming step. Accordingly, the wafer W can be divided so as to form an arcuate shape along the thickness of the wafer W by simply applying an external force to the wafer W in the dividing step. As a result, complication of each step and elongation of the time of each step can be suppressed to thereby effect efficient manufacture of the optical devices 1.

The present invention is not limited to the above preferred embodiment, but various modifications may be made. The size, shape, etc. of the parts in the above preferred embodiment shown in the attached drawings are merely illustrative and they may be suitably changed within the scope where the effect of the present invention can be exhibited. Further, the above preferred embodiment may be suitably modified without departing from the scope of the object of the present invention.

For example, while the dividing step is performed by using a breaking apparatus in the above preferred embodiment, the dividing step in the above preferred embodiment may be performed by using any apparatus capable of dividing the optical device wafer W along the division lines ST to obtain the individual optical devices 1. Further, the steps of the optical device manufacturing method in the above preferred embodiment may be performed by using separate apparatuses or by using the same apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method for optical devices each including a substrate, and a light emitting layer formed on a front surface of said substrate, both the front surface and a back surface of said substrate being parallel to each other and having substantially the same rectangular shape, said substrate having four side surfaces connecting the front surface and the back surface of said substrate, wherein of said four side surfaces, each of the two side surfaces adjacent to each other has a convex sectional shape between the front surface and the back surface of said substrate, and each of the other two side surfaces adjacent to each other has a concave sectional shape between the front surface and the back surface of said substrate, said manufacturing method comprising:

an attaching step of attaching a protective tape to a front side of an optical device wafer having a light emitting layer on the front side, said light emitting layer of said optical device wafer being partitioned by a plurality of crossing division lines to define a plurality of separate regions where said optical devices are respectively formed;

a modified layer forming step of applying a laser beam having a transmission wavelength to said optical device wafer along each division line from a back side of said optical device wafer after performing said attaching step, in the condition where the focal point of said laser beam is adjusted inside said optical device wafer so as to be stepwise shifted along the thickness of said optical device wafer from the front side to the back side thereof, thereby forming a plurality of modified layers juxtaposed in the direction along the thickness of said optical device wafer; and a dividing step of applying an external force to said optical device wafer after performing said modified layer forming step, thereby dividing said optical device wafer along each division line to obtain said individual optical devices;

said plurality of modified layers juxtaposed in the direction along the thickness of said optical device wafer being arcuately arranged in the direction along the thickness of said optical device wafer in said modified layer forming step;

a crack being formed between any adjacent ones of said plural modified layers arcuately arranged in the direction along the thickness of said optical device wafer in said dividing step, thereby dividing said optical device wafer along each division line so as to form an arcuate sectional shape corresponding to the shape of each side surface of said substrate of each optical device.

* * * * *